(12) United States Patent
Wang et al.

(10) Patent No.: US 6,543,015 B1
(45) Date of Patent: Apr. 1, 2003

(54) EFFICIENT DATA COMPRESSION CIRCUIT FOR MEMORY TESTING

(75) Inventors: Gyh-Bin Wang, Chung-Li (TW); Der-Min Yuan, Hsin-Chuang (TW)

(73) Assignee: Etron Technology, Inc., Hsin-Chu (TW)

(*) Notice: Subject to any disclaimer, the term of this patent is extended or adjusted under 35 U.S.C. 154(b) by 0 days.

(21) Appl. No.: 09/336,785

(22) Filed: Jun. 21, 1999

(51) Int. Cl.[7] .................................................. G06F 11/00
(52) U.S. Cl. ....................................... 714/718; 324/765
(58) Field of Search .......................... 714/718, 42, 719, 714/730, 731–732, 744, 745, 710, 738; 324/210, 765; 360/24, 47, 53; 365/200, 230.01–230.09, 63; 386/2, 47, 13, 85, 21, 113; 702/117–120; 257/203, 208; 711/170, 103; 710/68

(56) References Cited

U.S. PATENT DOCUMENTS

| | | | | |
|---|---|---|---|---|
| 5,313,424 A | * | 5/1994 | Adams et al. ............... | 714/711 |
| 5,515,383 A | * | 5/1996 | Katoozi ....................... | 714/732 |
| 5,619,512 A | * | 4/1997 | Kawashima et al. ........ | 714/718 |
| 5,745,500 A | * | 4/1998 | Damarla et al. ............. | 714/732 |
| 5,854,796 A | * | 12/1998 | Sato ............................ | 714/718 |
| 5,885,846 A | * | 3/1999 | Beffa ........................... | 438/18 |
| 5,892,721 A | | 4/1999 | Kim ............................ | 365/201 |
| 5,896,333 A | | 4/1999 | Nakashima et al. ........ | 365/201 |
| 6,026,505 A | * | 2/2000 | Hedberg et al. ............ | 714/711 |
| 6,118,711 A | * | 9/2000 | Merritt ........................ | 365/200 |
| 6,173,238 B1 | * | 1/2001 | Fujisaki ...................... | 702/117 |

OTHER PUBLICATIONS

Farutani et al., "A Board Level Parallel Test and Short Circuit Failure Repair Circuit for High–Density, LowPower DRAM's", Symposium on VLSI Circuits Digest of Technical Papers, pp. 70–71, 1996.
Wu et al., "An SDRAM Interface for Simplified "At Speed" Testing of the SLDRAM Internal Array".
Proceedings, International Workshop on Memory Technology, Design and Testing, pp. 38–44, 1998.

* cited by examiner

*Primary Examiner*—Albert Decady
*Assistant Examiner*—Guy Lamarre
(74) *Attorney, Agent, or Firm*—George O. Saile; Stephen B. Ackerman

(57) ABSTRACT

In this invention two compression circuits are combined to produce at a single output pass/fail condition for a plurality of memory addresses and a plurality of I/O. The output of an address compression circuit is connected to an I/O circuit. An I/O compression circuit is connected to several I/O circuits and the output of the I/O compression circuit controls a selected data output driver to provide a combined test result of the plurality of addresses and the plurality of I/O. The combination of the two compression circuits is made possible because the address data compression circuits and the I/O compression circuits use different truth tables.

13 Claims, 3 Drawing Sheets

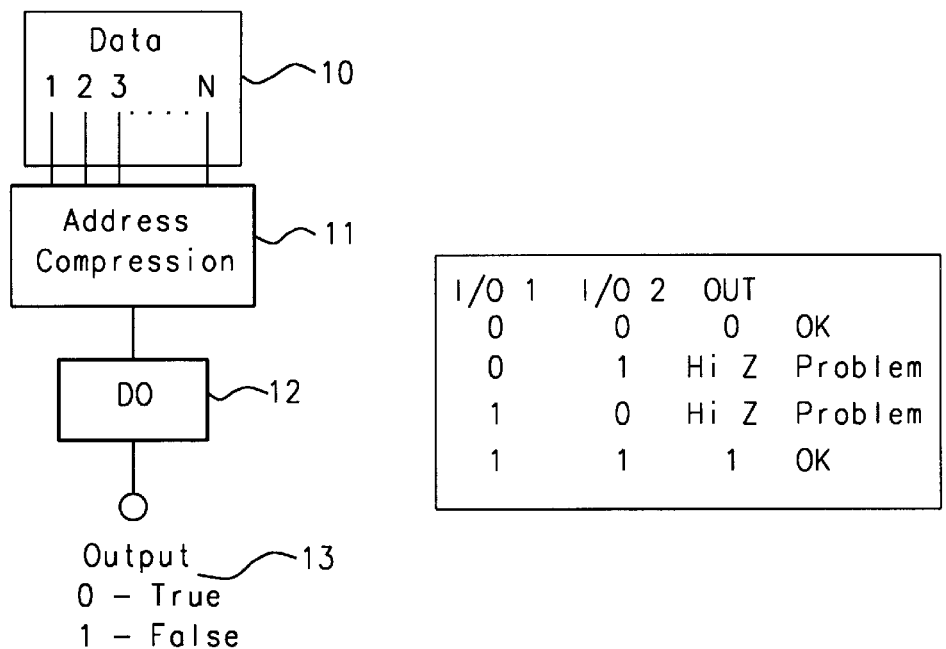
FIG. 1
Prior Art
FIG. 2a
Prior Art
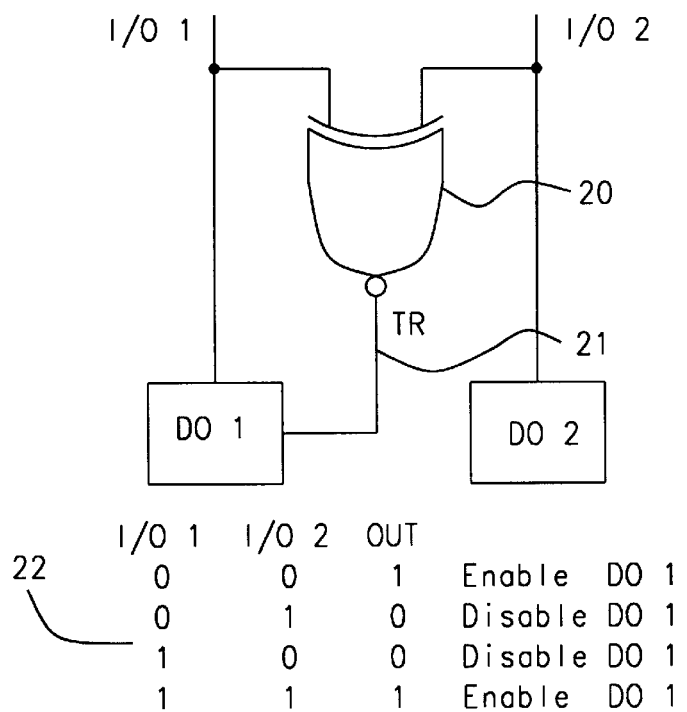
FIG. 2b - Prior Art

EFFICIENT DATA COMPRESSION CIRCUIT FOR MEMORY TESTING

BACKGROUND OF THE INVENTION

1. Field of Invention

This invention relates to memory testing and in particular the compression of test data to provide efficiency in testing a plurality of memory sections and data I/O.

2. Description of Related Art

The testing of integrated circuits has many challenges for reducing test time. The same data can be written to a number of memory cells at the same time and then read out to be compared with the written data to reduce the number of addresses used during testing. Also memory chips can have more than one output terminal. Testing can be constrained by the space needed to support a number of output pins on a test board.

In U.S. Pat. No. 5,896,333 (Nakashima et al.) is described a memory test using a timer that is controlled to be shorter in length than the time allowed during normal memory operations. In U.S. Pat. No. 5,892,721 (Kim) describes a parallel test circuit for a memory where a main amplifier compares and amplifies two bit data capable of testing a 2n number of data with an n number of main amplifiers. In K. Furutani et al., "A Board Level Parallel Test and Short Circuit Failure Repair Circuit for High Density, Low Power DRAMS", Symposium on VLSI Circuits Digest of Technical Papers, pp 70–71, 1996; a board level parallel test circuit is proposed as a means to be able to perform such tests as data retention time and cope with the increasing density of DRAMs. In John Wu et al., "An SDRAM Interface for Simplified "At-Speed" Testing of the SLDRAM Internal Array", Proceedings, International Workshop on Memory Technology, design and Testing, pp 38–44, 1998; the testing and characterization of an SDRAM array is discussed without the cost of using high speed testers for the entire test and characterization program.

Data compression provides a means by which the data of a plurality of I/O can be compressed to one output to provide a single pass/fail result. This can be extremely useful when testing a plurality of memory chips where the space to monitor each output is limited.

SUMMARY OF THE INVENTION

In this invention an address compression circuit and an I/O compression circuit are combined. The memory address compression result is connected to a data output circuit and several data output circuits are compressed in an I/O compression circuit. This produces a single output containing the combined test results of a plurality of memory addresses and a plurality of I/O circuits. There are three states of the combined address compression and the I/O compression; a logical zero that defines all test results are good, a logical one and a high impedance state (HiZ) that indicate that one or more addresses and/or I/O circuits are bad.

The ability to produce a combined result with the two compression circuits is a result of the two compression circuits having different truth tables. The address compression circuit indicates a failure with a logical one, and the I/O compression circuit controls the high and low impedance of the output. The output of the combined address and I/O compression circuits produce a logical zero to indicate all data that is compressed is correct and all other output states, which include HiZ and a logical one, indicate that a least one compressed piece of data is incorrect.

If the combined compression circuits are used at the wafer test, failing chips are sent back for diagnostics and repair. At the package level, a detected failure is not repairable, and the part exhibiting a failure is discarded. The use of the I/O compression allows more chips to be tested because there is more space available as a result of fewer support circuits needed to accommodate a fewer number of I/O output pins having test data.

BRIEF DESCRIPTION OF THE DRAWINGS

This invention will be described with reference to the accompanying drawings, wherein:

FIG. 1 is a block diagram of an address compression circuit of prior art,

FIG. 2a is a truth table for an I/O compression circuit of prior art,

FIG. 2b is a block diagram of an I/O compression circuit,

DETAILED DESCRIPTION OF THE PREFERRED EMBODIMENT

Figure 3:
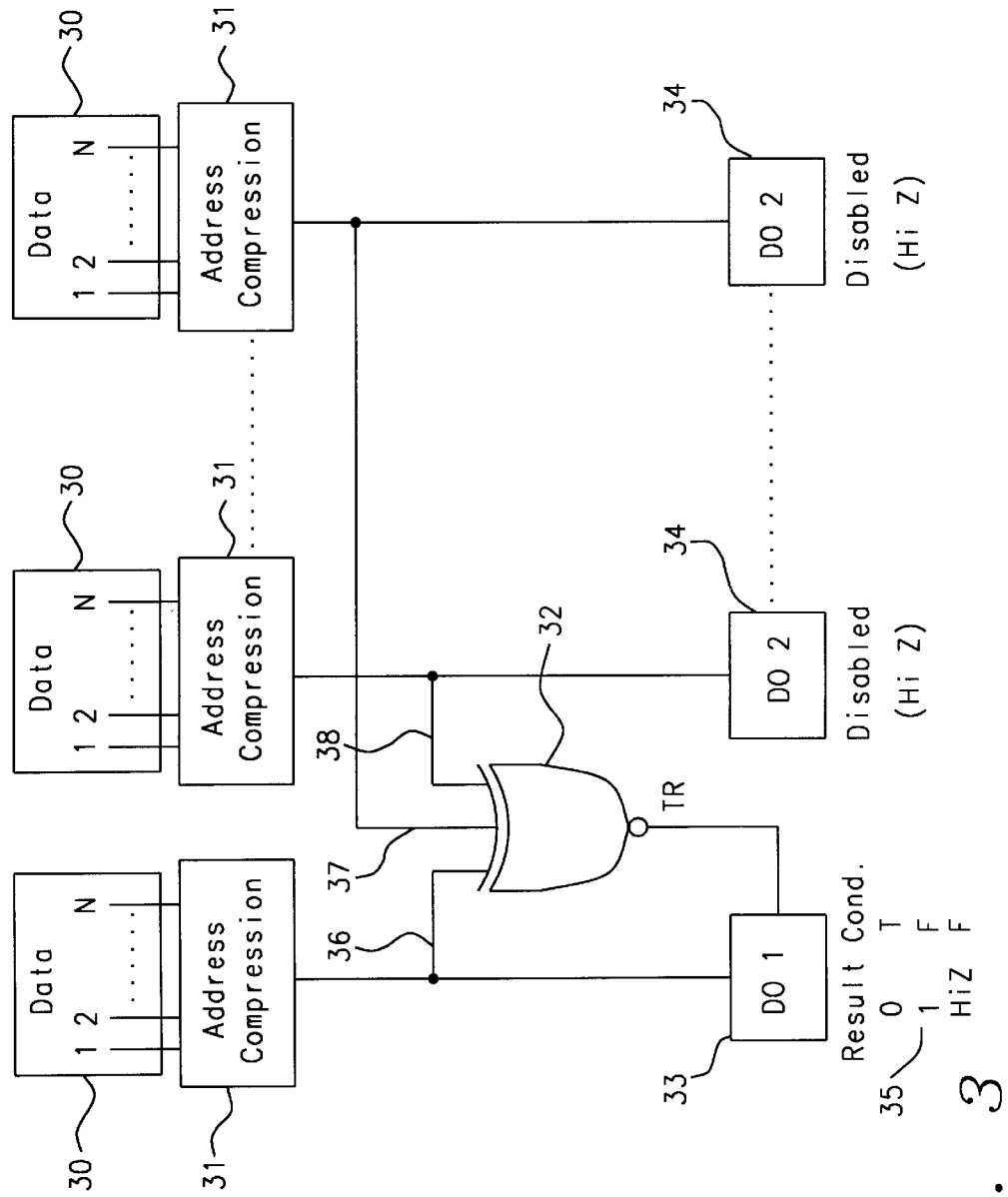
FIG. 3 is a block diagram of a combined address compression circuit and I/O compression circuit of this invention.

In FIG. 1 is shown a circuit of prior art for an address compression circuit. A number of N addresses of data 10 is compressed by an address compression circuit 11 to a single data output DO 12. The output truth table 13 shows that if the data for all N addresses 10 is correct, the data output 12 will have a logical value of zero. If the data for one or more addresses 10 is incorrect, the data output 12 will have a logical value of one indicating a failure. If this address testing is done at the wafer level, a failing chip will be sent back for diagnostics and repair. If the testing is done at the package level, a failing chip will be scrapped.

In FIG. 2a, a truth table of prior art is shown for the compression of two I/O circuits. If both the I/O circuits have a logical value of zero or one, the I/O circuits are good. If one I/O circuit is a logical one and the other is a logical zero, the output of the compression circuit is a high impedance (HiZ) indicating that there is a problem. In FIG. 2b is an I/O compression circuit of prior art that performs according to the truth table shown in FIG. 2a. The compression circuit shown in FIG. 2b comprises an exclusive NOR circuit 20 with inputs connected to I/O 1 and I/O 2. The output of the exclusive NOR circuit is connected to a data out driver DO 1 and controls DO1 to be enabled or disabled according to the truth table 22. If both inputs to the exclusive NOR 20 are the same, the output 21 of the exclusive NOR 20 is TR=1 which enables DO 1. If the inputs, I/O 1 and I/O 2, to the exclusive NOR 20 are dissimilar, then TR=0 and DO 1 is disabled. Thus when I/O 1 and I/O 2 are dissimilar indicating a problem the data output driver DO 1 is disabled and in a high impedance state, HiZ.

In FIG. 3 a plurality of address compression circuits 31 are connected to an I/O compression circuit comprising an exclusive NOR circuit 32 controlling a data out circuit 33. Other data out circuits 34 are disabled and in a HiZ state. Each address compression circuit 31 compresses data 30 resulting from address compression testing of a storage array. An I/O compression circuit is connected between data out drivers 33 and 34 of the same chip. Referring to FIG. 2b, the exclusive NOR circuit 32 controls the data output driver (DO 1) 33 to be "on" when the inputs to the Exclusive NOR are all the same value, either all logical ones or all logical zeros. The data output driver 33 is controlled off, in HiZ state, when at least one of the inputs 36, 37 or 38 of the exclusive NOR is a different value than the rest of the inputs 36, 37, and 38.

Continuing to refer to FIG. 3, the address compression circuits 31 provide a logical zero to the inputs 36, 37 and 38 of the exclusive NOR when the address data 30 are all correct and a logical one when the data 30 of at least one memory address is not correct. When the address compression circuit 31 is combined with the I/O compression circuit comprising the exclusive NOR circuit 32 and the data output driver 33, the result condition 35 occurs. The data output driver (DO 1) 33 is enabled when the inputs 36, 37 and 38 to the exclusive NOR are either all logical ones or logical zeros, and disabled when at least one input 36, 37 or 38 is different than the rest. The output of the address compression circuit 31 is a logical zero if the data for all addresses test good and is a logical one when the data for at least one address fails. This allows the address compression circuit to be combined with the I/O compression circuit as shown in FIG. 3, and produce the truth table of the result condition 35. The output of the data output driver (DO 1) 33 is a logical zero when data of all elements 30, 36, 37 and 38 that are compressed by the two compression circuits test good producing a true "T" condition. The output of the data output driver (DO 1) 33 is a logical one when there is a failure in all of the address data 30 producing a false "F" condition, and the output of data output driver (DO 1) 33 driver is in a HiZ state when at least one address 30 or one I/O line 36, 37 or 38 have failed producing a false "F" condition.

Figure 4:
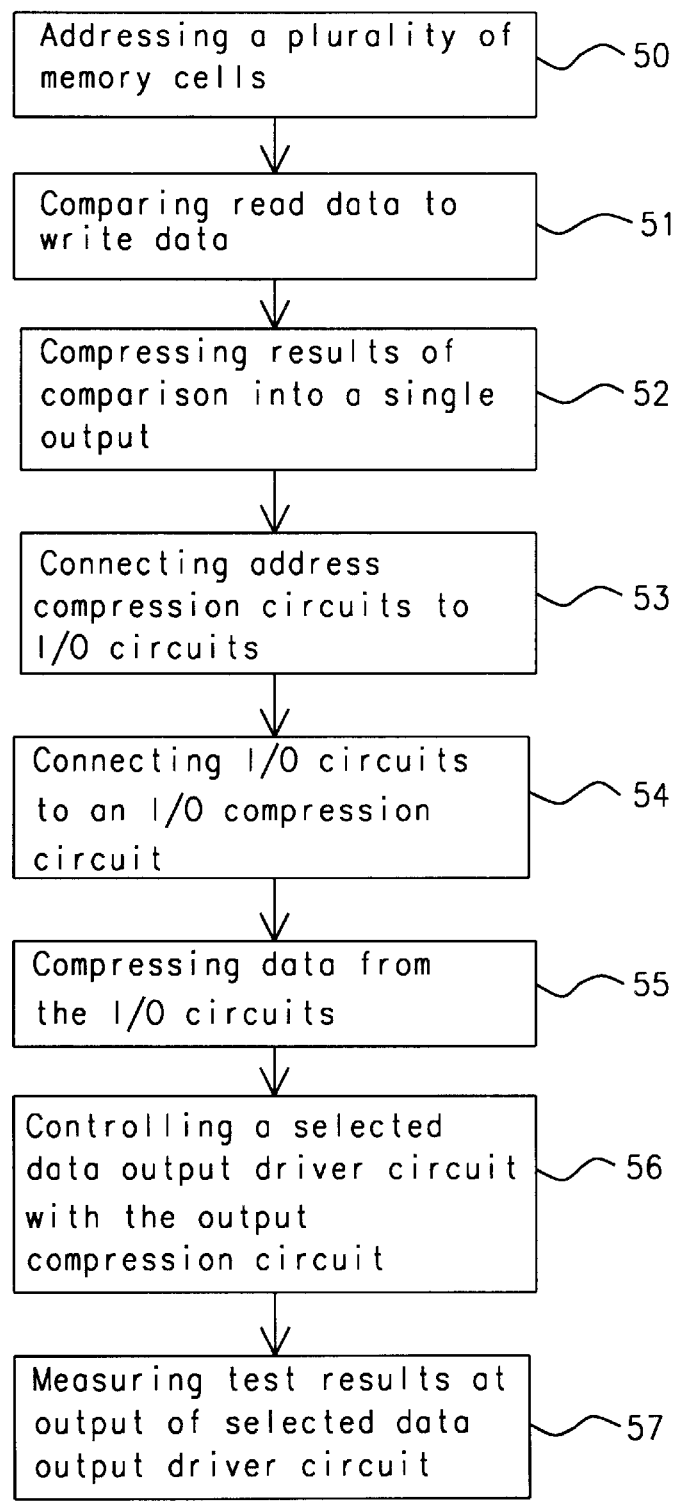
FIG. 4 is a diagram of the method of this invention for combining an address compression circuit and an I/O compression circuit to produce test data at a single output.

Referring to FIG. 4, a method is shown to combine an address compression circuit with an I/O compression circuit and produce combined test results at the output of a selected data output driver circuit. A plurality of memory cells are addressed 50 and the data read from the cells is compared with the data that was written 51. The comparison produces a pass or fail result. The result of the comparison is compressed in an address compression circuit 52 producing a logical zero if the data for all addresses is good and a logical one if the data for at least one address fails. The output of a plurality of address compression circuits are connected to a plurality of I/O circuits 53. The I/O circuits are connected to an I/O compression circuit 54, and the data from the I/O circuits is compressed 55 to control a selected data output driver circuit 56. The combined test results from the memory address circuits and the I/O circuits are measured at the output of the selected data output driver circuit 57. If the output of the selected driver is a logical zero, all memory address data and all I/O circuits are good. If the output of the driver is a logical one, all of the I/O circuits or memory address data has a failure, and if the driver is in a HiZ state, there is one or more failing bits among the memory addresses and/or the I/O.

While the invention has been particularly shown and described with reference to preferred embodiments thereof, it will be understood by those skilled in the art that various changes in form and details may be made without departing from the spirit and scope of the invention.

What is claimed is:

1. A double compression circuit for combining test results into a single output, comprising:
   a) a plurality of address compression circuits to combine test results of a plurality of memory addresses of a memory chip,
   b) an I/O compression circuit to combine test results of a plurality of I/O circuits of said memory chip,
   c) said plurality of address compression circuits connected to input of said I/O compression circuit,
   d) said I/O compression circuit controlling a data output circuit to produce a single compressed output combining pass or fail test results from said plurality of memory addresses and said plurality of I/O circuits into a data state of said data output circuit to indicate pass or fail of said memory chip.

2. The double compression circuit of claim 1, wherein said I/O compression circuit uses an exclusive NOR to combine results of memory address testing and data output testing.

3. The double compression circuit of claim 2, wherein said exclusive NOR controls a data output circuit to produce a combined test result for memory address testing and data output testing.

4. The double compression circuit of claim 1, wherein said address compression circuits reduce a plurality of test results from a plurality of memory addresses to a single output.

5. The double compression circuit of claim 1, wherein said I/O compression circuits reduce a plurality of test results from a plurality of I/O circuits to a single output.

6. The double compression circuit of claim 4 or 5, wherein a single failure in one of said plurality of test results causes a failure at said single output.

7. A method to compress address tests and data output tests into one output result, comprising:
   a) addressing a plurality of cells of a memory chip,
   b) comparing read data to write data for said plurality of cells of said memory chip,
   c) compressing results of comparing said read data to said write data into a single pass or fail output of an address compression circuit,
   d) connecting a plurality of said address compression circuits to a plurality of I/O circuits,
   e) connecting said plurality of I/O circuits to inputs of an I/O compression circuit,
   f) compressing data from said plurality of I/O circuits with said I/O compression circuit,
   g) controlling a selected output driver circuit with said I/O compression circuit,
   h) measuring a pass or fail result of address testing and I/O testing combined into a single signal state at an output of said selected output driver circuit of said memory chip.

8. The method of claim 7, wherein compressing said data of said plurality of I/O circuits is done with an exclusive NOR circuit controlling on and off states of said selected output driver circuit to provide a combined addressing and I/O circuit test results.

9. The method of claim 8, wherein compressing said data of said plurality of I/O circuits with said exclusive NOR circuit compresses said data containing compressed address data.

10. The method of claim 7, wherein measuring said results at said output of said selected output driver circuit produces no failures indicating that all address and I/O testing results are good.

11. The method of claim 7, wherein measuring said results at said output of said selected output driver circuit produces a failure indicating at least one address or one I/O circuit is bad.

12. The method of claim 7, wherein measuring said pass or fail results at said output of said selected output driver circuit at a wafer level returns said wafer to a chip repair procedure when a failure signal is measured.

13. The method of claim 7, wherein measuring said pass or fail results at said output of said selected output driver circuit at a package level discards said packaged chip from production when a failure signal is measured.

* * * * *